US011290015B2

(12) United States Patent
Liang

(10) Patent No.: US 11,290,015 B2
(45) Date of Patent: Mar. 29, 2022

(54) DRIVING CIRCUIT WITH ENERGY RECYCLE CAPABILITY

(71) Applicant: xMEMS Labs, Inc., Santa Clara, CA (US)

(72) Inventor: Jemm Yue Liang, Sunnyvale, CA (US)

(73) Assignee: xMEMS Labs, Inc., Santa Clara, CA (US)

(*) Notice: Subject to any disclaimer, the term of this patent is extended or adjusted under 35 U.S.C. 154(b) by 0 days.

(21) Appl. No.: 17/022,060

(22) Filed: Sep. 15, 2020

(65) Prior Publication Data

US 2021/0175798 A1 Jun. 10, 2021

Related U.S. Application Data

(60) Provisional application No. 63/053,662, filed on Jul. 19, 2020, provisional application No. 63/038,062, filed on Jun. 11, 2020, provisional application No. 62/977,027, filed on Feb. 14, 2020, provisional application No. 62/946,323, filed on Dec. 10, 2019.

(51) Int. Cl.
*H02M 3/158* (2006.01)
*H02M 1/08* (2006.01)
*H02M 3/155* (2006.01)

(52) U.S. Cl.
CPC .......... *H02M 3/1584* (2013.01); *H02M 1/08* (2013.01); *H02M 3/155* (2013.01)

(58) Field of Classification Search
CPC ....... H02M 3/1584; H02M 1/08; H02M 3/155
See application file for complete search history.

(56) References Cited

U.S. PATENT DOCUMENTS

| 5,734,258 | A | 3/1998 | Esser | |
|---|---|---|---|---|
| 8,593,115 | B2* | 11/2013 | Walter | H02M 3/1588 323/223 |
| 8,885,370 | B2* | 11/2014 | Takegami | H02M 1/34 363/56.06 |
| 11,133,784 | B2 | 9/2021 | Liang | |
| 2009/0039852 | A1 | 2/2009 | Fishelov | |
| 2011/0235831 | A1 | 9/2011 | Kaiho | |
| 2012/0013271 | A1* | 1/2012 | Lei | H02M 3/1584 315/308 |
| 2012/0134180 | A1* | 5/2012 | Watanabe | H02M 3/1584 363/17 |

(Continued)

FOREIGN PATENT DOCUMENTS

| CN | 103840663 A | 6/2014 |
|---|---|---|
| CN | 108569159 A | 9/2018 |

(Continued)

OTHER PUBLICATIONS

M. Hänsler et al., Design of a MEMS speaker driver, Elektrotechnik & Informationstechnik (2018), Jan. 23, 2018, pp. 10-17, 135/1, XP036438128, https://doi.org/10.1007/s00502-018-0593-8.

*Primary Examiner* — Kyle J Moody
(74) *Attorney, Agent, or Firm* — Winston Hsu

(57) ABSTRACT

A driving circuit is disclosed. The driving circuit includes a charging circuit, coupled between a voltage source and a load, configured to form a first current from the voltage source to the load; and a discharging circuit, coupled between the voltage source and the load, configured to form a second current from the load back to the voltage source.

30 Claims, 17 Drawing Sheets

(56) References Cited

U.S. PATENT DOCUMENTS

| | | |
|---|---|---|
| 2013/0015820 A1 | 1/2013 | Kim |
| 2015/0367735 A1* | 12/2015 | Baker ................ H02M 3/1582 307/10.1 |
| 2016/0211750 A1* | 7/2016 | Coleman .................... H02J 1/10 |
| 2017/0207723 A1 | 7/2017 | Zhang |
| 2017/0355364 A1* | 12/2017 | Wain .................... B60W 20/15 |
| 2018/0091056 A1 | 3/2018 | Reddiconto |
| 2018/0175774 A1* | 6/2018 | Nakayama .............. H02M 1/32 |
| 2018/0257496 A1* | 9/2018 | Andoh .................... B60L 58/13 |
| 2018/0281605 A1* | 10/2018 | Sawazaki ........... B60L 11/1803 |
| 2019/0044488 A1 | 2/2019 | Travis |
| 2019/0103806 A1* | 4/2019 | Miyake ................ H02M 3/155 |
| 2019/0109529 A1* | 4/2019 | Nobe .................... G01R 19/10 |
| 2019/0109530 A1 | 4/2019 | Perreault |
| 2019/0115830 A1 | 4/2019 | Giuliano |
| 2019/0157986 A1* | 5/2019 | Ginart .................... H02J 7/022 |
| 2020/0136510 A1* | 4/2020 | Nam ........................ H02J 7/00 |
| 2020/0177017 A1* | 6/2020 | Reilly ................ H02M 3/1584 |
| 2020/0304026 A1* | 9/2020 | Mu ..................... H02M 1/4208 |
| 2020/0313567 A1* | 10/2020 | Porter, Jr ............ H02M 1/4208 |
| 2020/0373841 A1 | 11/2020 | Xie |
| 2021/0044219 A1 | 2/2021 | Sato |
| 2021/0194369 A1 | 6/2021 | Kim |

FOREIGN PATENT DOCUMENTS

| | | |
|---|---|---|
| CN | 108885677 A | 11/2018 |
| EP | 2 648 324 A2 | 10/2013 |
| EP | 2 648 324 A3 | 4/2018 |
| JP | 2000-333445 A | 11/2000 |
| JP | 2013-9176 A | 1/2013 |
| JP | 2013-9179 A | 1/2013 |
| WO | 2014/110474 A1 | 7/2014 |
| WO | 2019/171701 A1 | 9/2019 |

* cited by examiner

DRIVING CIRCUIT WITH ENERGY RECYCLE CAPABILITY

CROSS REFERENCE TO RELATED APPLICATIONS

This application claims the benefit of U.S. provisional application No. 62/946,323, filed on Dec. 10, 2019, U.S. provisional application No. 62/977,027, filed on Feb. 14, 2020, U.S. provisional application No. 63/038,062, filed on Jun. 11, 2020, U.S. provisional application No. 63/053,662, filed on Jul. 19, 2020, which is incorporated herein by reference.

BACKGROUND OF THE INVENTION

1. Field of the Invention

The present application relates to a driving circuit, and more particularly, to a driving circuit capable of energy recycling.

2. Description of the Prior Art

Recently, piezoelectric-actuated speakers (piezo-speakers) have emerged. Due to the capacitive nature of thin film piezoelectric actuators, these piezo-speakers present highly capacitive loads to the amplifiers. However, conventional driving circuits, such as class-AB, -D, -G, -H amplifiers, have all evolved assuming the loading (coils made of very fine wires) will be mostly resistive and slightly inductive, these amplifiers are inefficient when driving the highly capacitive loads such as piezo-speakers.

In addition, due to the capacitive nature of the load, the current and driving voltage would be about 90° out of phase. As a result, piezo-speakers do not actually consume much of the power during the charging phase. Most of the energy drawn during the charging phase is stored inside the capacitance of the load. However, during the discharging phase, when the voltage across the speaker terminals decreases, conventional class-AB, -D, -G or -H amplifiers will simply drain the energy from the capacitance of the load to the ground (or to the negative power supply), which is wasted.

Therefore, it is necessary to improve the prior art.

SUMMARY OF THE INVENTION

It is therefore a primary objective of the present application to provide a driving circuit with energy recycle capability, to improve over disadvantages of the prior art.

An embodiment of the present application discloses a driving circuit. The driving circuit comprises a charging circuit, coupled between a voltage source and a load, configured to form a first current from the voltage source to the load; and a discharging circuit, coupled between the voltage source and the load, configured to form a second current from the load back to the voltage source.

These and other objectives of the present invention will no doubt become obvious to those of ordinary skill in the art after reading the following detailed description of the preferred embodiment that is illustrated in the various figures and drawings.

DETAILED DESCRIPTION

In the present application, the term "coupled to" may refer to direct or indirect connection. "Component A being coupled to component B" may indicate that component A is directly connected to component B or component A is connected to component B via some component C.

Figure 1:
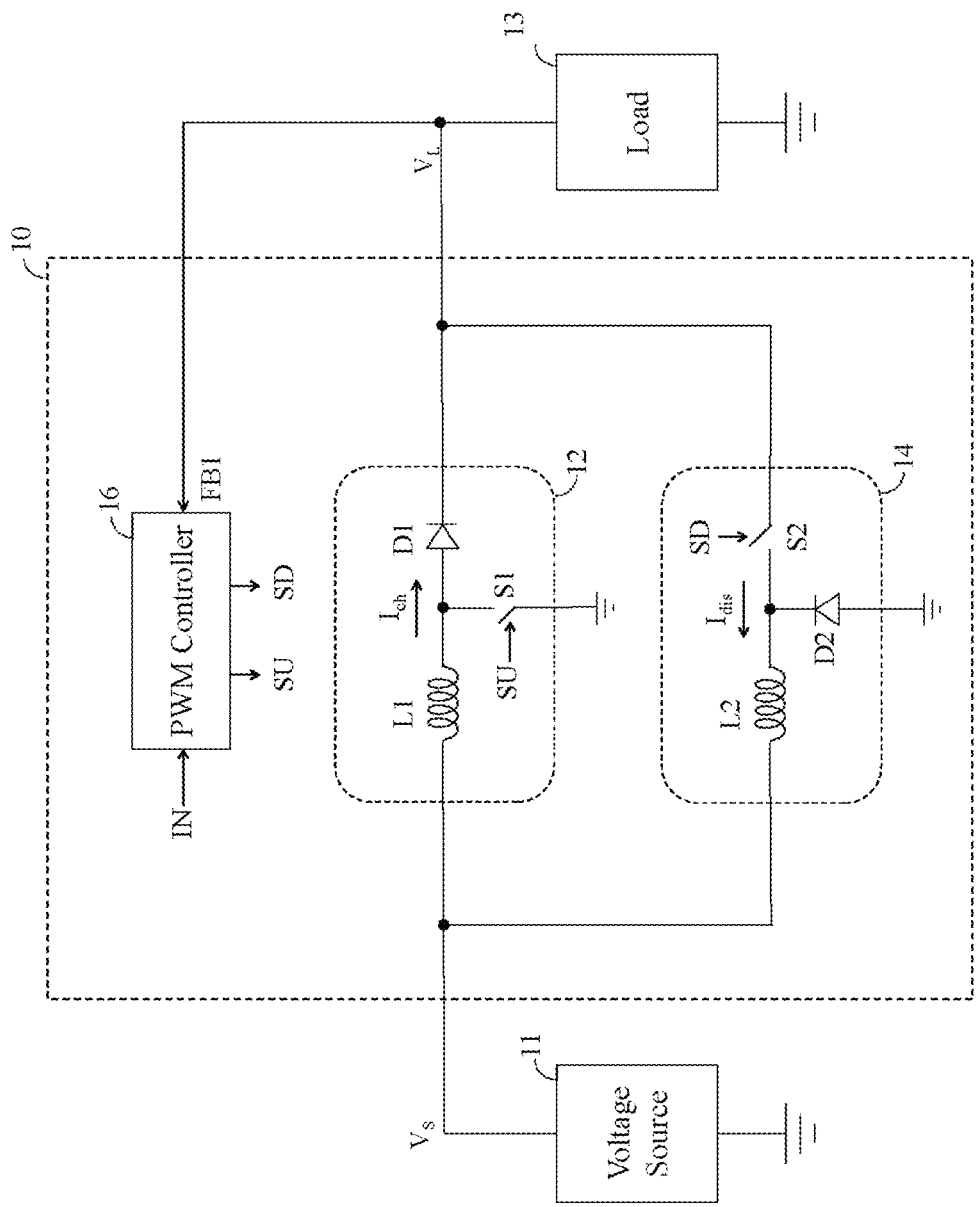
FIG. 1 is a schematic diagram of a driving circuit according to an embodiment of the present application.

FIG. 1 is a schematic diagram of a driving circuit 10 according to an embodiment of the present application. The driving circuit 10, coupled between a voltage source 11 and a load 13, receives an input signal IN to drive the load 13 according to the input signal IN.

The voltage source 11 may own energy storage capability. For example, the voltage source 11 may comprise a battery (which may or may not be a rechargeable battery) or a DC (direct current) power supply, e.g., a DC-DC switching power supply. In an embodiment, the voltage source 11 (e.g., the DC-DC switching power supply) may comprise a capacitor or have capacitance therein.

In an embodiment, the load 13 may comprise a speaker, or equivalently, a sound producing device or an acoustic transducer. In this case, the input signal IN may be an audio signal. In an embodiment, the speaker within the load 13 may comprise a piezoelectric actuated speaker. Specifically, the driving circuit 10 may be connected to a piezoelectric actuator of the piezoelectric actuated speaker. The piezoelectric actuator within the load 13 may comprise a piezoelectric layer sandwiched between a first/top electrode and a second/bottom electrode. Moreover, the driving circuit 10 may be connected to the electrodes of the actuator. Note that, significant capacitance exists between the first/top electrode and the second/bottom electrode.

The driving circuit 10 is configured not only to form a charging current from the voltage source 11 to the load 13 during a charging phase, but also to form a discharging current from the load 13 back to the voltage source 11 during a discharging phase. In this regard, energy stored in the capacitance within the load 13 during the charging phase would be recycled back to the capacitance within (or along with) the voltage source 11 during the discharging phase, such that an overall consumed energy is reduced.

Specifically, the driving circuit 10 comprises a charging circuit 12, a discharging circuit 14 and a PWM (pulse width modulation) controller 16. The charging circuit 12 and the discharging circuit 14 have a first terminal coupled to the voltage source 11 and a second terminal coupled to the load 13. The charging circuit 12 is configured to form a first/charging current $I_{ch}$ (or to provide a first/charging current path) from the voltage source 11 to the load 13; the discharging circuit 14 is configured to form a second/discharging current $I_{dis}$ (or to provide a second/discharging current path) from the load 13 back to the voltage source 11.

Along with the capacitance within the load 13, the charging circuit 12 is similar to a boost converter (a kind of DC-DC converter), and the discharging circuit 14 is similar to a buck converter (another kind of DC-DC converter). In other words, it is can be regarded that the driving circuit 10 utilizes the boost converter (charging circuit 12) to perform a charging operation on the capacitance within the load 13, and utilizes the buck converter (discharging circuit 14) to perform a discharging operation on the capacitance within the load 13.

In an embodiment, during the charging phase, a time interval corresponding to an upswing portion of the input signal IN, the boost converter (charging circuit 12) provides the charging current $I_{ch}$ from the voltage source 11 to the load 13, to perform the charging operation; during the discharging phase, a time interval corresponding to a downswing portion of the input signal IN, the discharging circuit 14 directs the discharging current $I_{dis}$ from the load 13 back to the voltage source 11, to perform the discharging operation.

In the embodiment shown in FIG. 1, the charging circuit 12 comprises a switch S1, a diode D1 and an inductor L1; the discharging circuit 14 comprises a switch S2, a diode D2 and an inductor L2. The switch S1 is controlled by a first PWM signal SU, and the switch S2 is controlled by a second PWM signal SD, where the PWM signals SU and SD are generated by the PWM controller 16. The PWM controller 16 has a first input terminal to receive the input signal IN and a second input terminal coupled to the load 13 to receive a feedback signal FB1. The PWM controller 16 generates the PWM signals SU and SD according to the input signal IN and the feedback signal FB1, such that the driving circuit 10 drives the load 13 according to the input signal IN. The diodes D1 and D2 act as rectifying component, which will be elaborated later.

Connections between components within the driving circuit 10 are detailed as follows. Within the charging circuit 12, an anode of the diode D1 is coupled to the voltage source 11 via the inductor L1, a cathode of the diode D1 is coupled to the load 13. A first terminal of the switch S1 is coupled to the anode of the diode D1. That is, a first terminal of the inductor L1 is coupled to the voltage source 11, and a second terminal of the inductor L1 is coupled to the anode of the diode D1 and the first terminal of the switch S1. In an embodiment, a second terminal of the switch S1 may be coupled to a ground terminal, as FIG. 1 illustrates, but not limited thereto. Within the discharging circuit 14, a first terminal of the switch S2 is coupled to the voltage source 11 via the inductor L2 and a second terminal of the second switch S2 is coupled to the load 13. A cathode of the diode D2 is coupled to the first terminal of the switch S2. That is, a first terminal of the inductor L2 is coupled to the voltage source 11, and a second terminal of the inductor L2 is coupled to the cathode of the diode D2 and the first terminal of the switch S2. In an embodiment, an anode of the diode D2 may be coupled to a ground terminal, as FIG. 1 illustrates, but not limited thereto.

In an embodiment, diodes D1, D2 may be replaced by Synchronous Rectifier (SR), comprising a switch/MOSFET with proper (gate) control signal, which will be elaborated later.

In an embodiment, the voltage source 11 and the load 13 may be coupled to a ground terminal, as FIG. 1 illustrates, but not limited thereto.

The voltage source 11 provides a supply/source voltage $V_S$, and the load 13 has a load voltage $V_L$. The driving circuit 10 may operate under a context that the supply/source voltage $V_S$ is no higher than the load voltage $V_L$, i.e., $V_S \leq V_L$.

Despite of the circuit topology being similar to the DC-DC switching power supply (e.g., the boost convert and/or the back convert), the control mechanism of the switch S1/S2 is similar to which is used in conventional class D amplifier, where the switch S1/S2 is controlled by the PWM signal generated according to the input signal IN and the feedback signal FB1 and by the PWM controller. The PWM controller will be detailed later.

Different from driving circuit in the art, the discharging current $I_{dis}$ is diverted, by the discharging circuit 14, toward the voltage source 11, instead of toward a ground terminal or another voltage source (e.g., a negative voltage source). It can be regarded that the energy/charge store in the capacitance within the load 13 is recycled and stored in the voltage source 11. Therefore, the power consumption of the driving circuit is significantly reduced.

Figure 2:
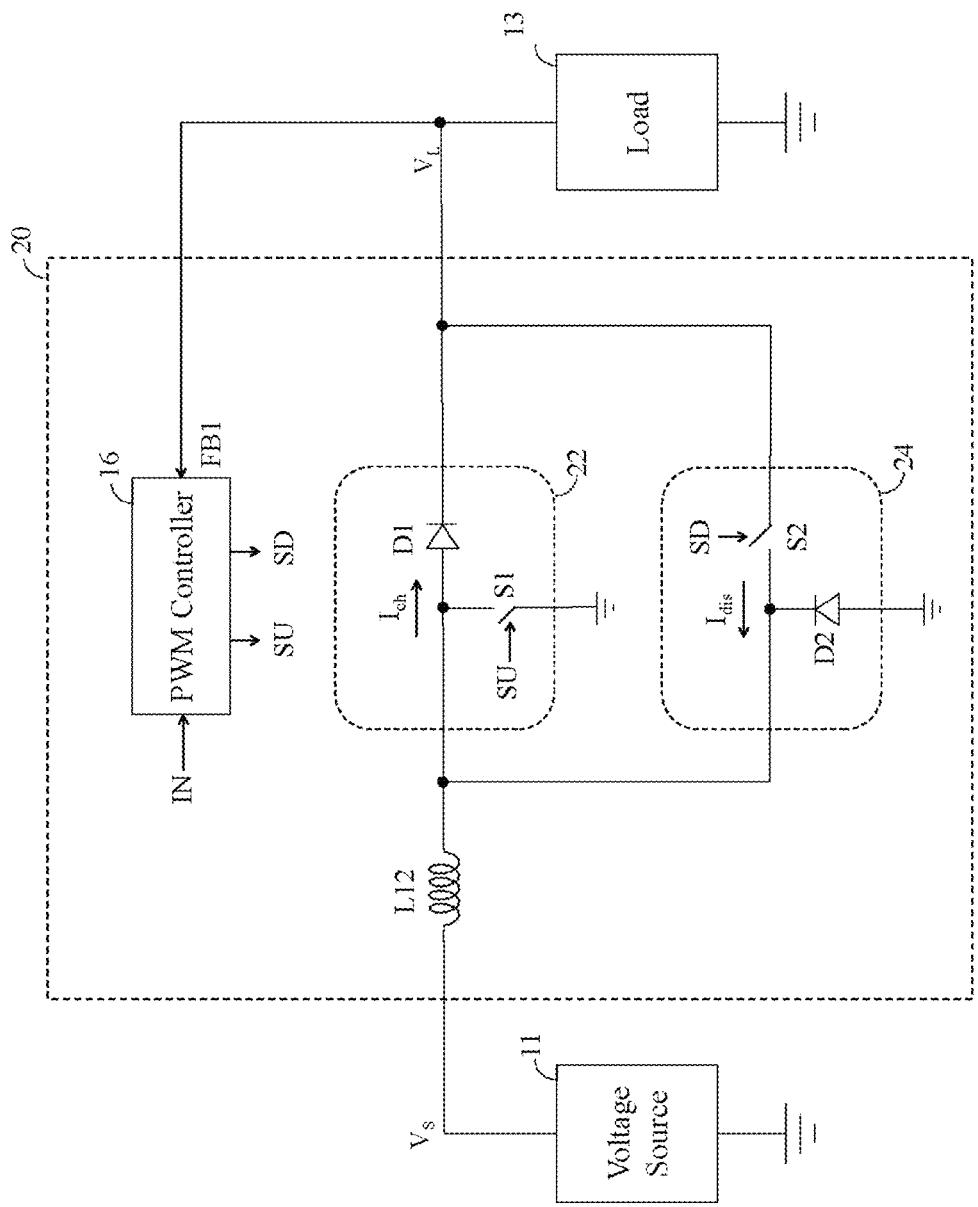
FIG. 2 is a schematic diagram of a driving circuit according to an embodiment of the present application.

In addition, given the inductor increases cost and occupies more physical space, the inductors L1 and L2 may be merged. For example, FIG. 2 is a schematic diagram of a driving circuit 20 according to an embodiment of the present application. The driving circuit 20 is similar to the driving circuit 10, and thus, same components are annotated by same notations. Different from the driving circuit 10, the inductors L1 and L2 are replaced by an inductor L12. A charging circuit 22 and a discharging circuit 24, comprised by the driving circuit 20, share the same inductor L12. As FIG. 2 shows, a first terminal of the inductor L12 is coupled to the voltage source 11, and a second terminal of the inductor L12 is coupled to the anode of the diode D1, the first terminal of the switch S1, the cathode of the diode D2 and the first terminal of the switch S2.

Since the driving circuit 20 spares one inductor (compared to the circuit 10), the circuit 20 may be more compact than the circuit 10, and the inductor L21 used in the circuit 20 may be allowed to have larger core and bring higher saturation current $I_{SAT}$, so as to enhance the driving capability.

Figure 3:
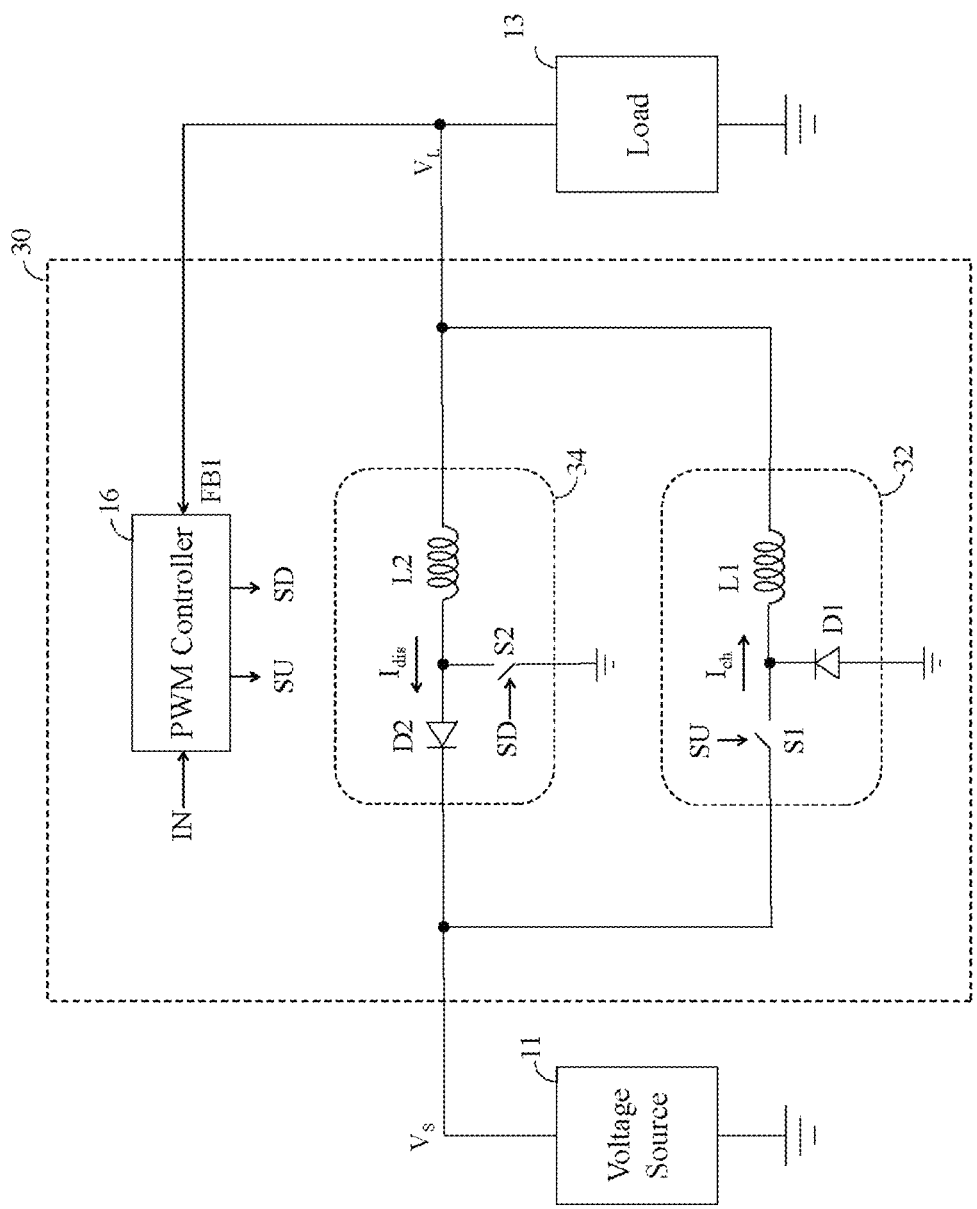
FIG. 3 is a schematic diagram of a driving circuit according to an embodiment of the present application.

In addition, the driving circuit of the present application may operate when $V_S \geq V_L$. Referring to FIG. 3, a schematic diagram of a driving circuit 30 according to an embodiment of the present application. The driving circuit 30 may operate under a condition of $V_S \geq V_L$. The driving circuit 30 comprises a charging circuit 32 and a discharging circuit 34. Different from the driving circuit 10, the charging circuit 32 is similar to a buck converter and the discharging circuit 34 is similar to a boost converter. In other words, the driving circuit 30 utilizes the buck converter (charging circuit 32) to add charge to the capacitance within the load 13, as illustrated by $I_{ch}$, and utilizes the boost converter (discharging circuit 34) to remove charge from the capacitance within the load 13, as illustrated by $I_{dis}$.

Connections between components within the driving circuit 30 are detailed as follows. Within the charging circuit 32, a first terminal of the switch S1 is coupled to the voltage source 11 and a second terminal of the switch S1 is coupled to the load 13 via the inductor L1. The cathode of the diode D1 is coupled to the second terminal of the switch S1. A first terminal of the inductor L1 is coupled to the cathode of the diode D1, and a second terminal of the inductor L1 is coupled to the load 13. In an embodiment, an anode of the diode D1 may be coupled to a ground terminal, as FIG. 3 illustrates, but not limited thereto. Within the discharging circuit 34, the cathode of the diode D2 is coupled to the voltage source 11, and the anode of the diode D2 is coupled to the load 13 via the inductor L2. A first terminal of the switch S2 is coupled to the anode of the diode D2. A first terminal of the inductor L2 is coupled to the cathode of the diode D2 and the first terminal of the switch S2. A second terminal of the inductor L2 is coupled to the load 13. In an embodiment, a second terminal of the switch S2 may be coupled to a ground terminal, as FIG. 3 illustrates, but not limited thereto.

Figure 4:
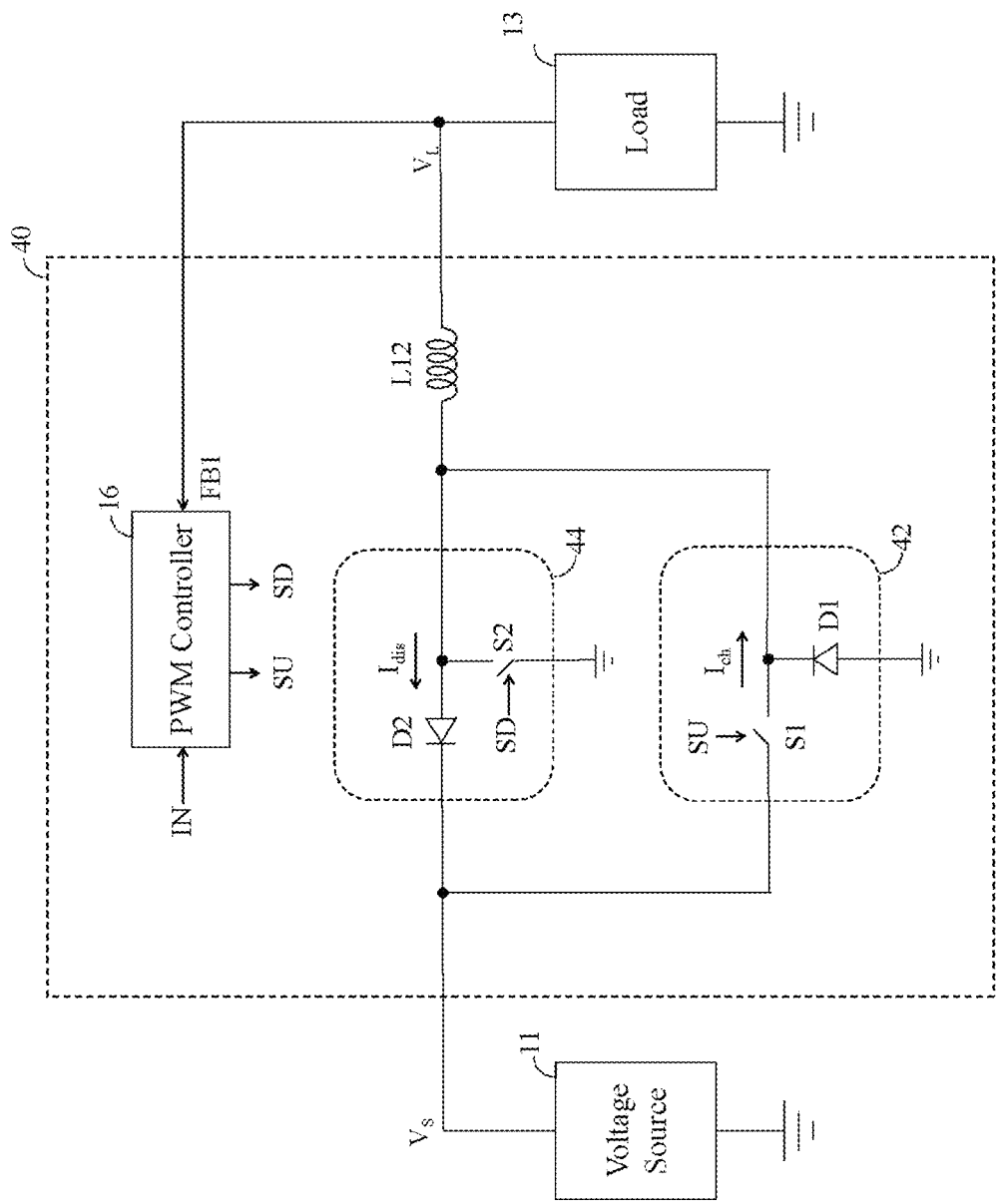
FIG. 4 is a schematic diagram of a driving circuit according to an embodiment of the present application.

Similar to the variation from the circuit 10 to the circuit 20, the inductors L1 and L2 in the driving circuit 30 may also be merged as the inductor L21. FIG. 4 is a schematic diagram of a driving circuit 40 according to an embodiment of the present application. As FIG. 4 shows, a first terminal of the inductor L12 is coupled to the cathode of the diode D1, the second terminal of the switch S1, the anode of the diode D2 and the first terminal of the switch S2. A second terminal of the inductor L12 is coupled to the load 13.

Note that, boost converter and/or buck converter can be used in the charging circuit and/or the discharging circuit, which is not limited thereto. Other types of DC-DC converter(s) may also be used as the charging circuit and/or the discharging circuit, which is also within the scope of present application.

Figure 5:
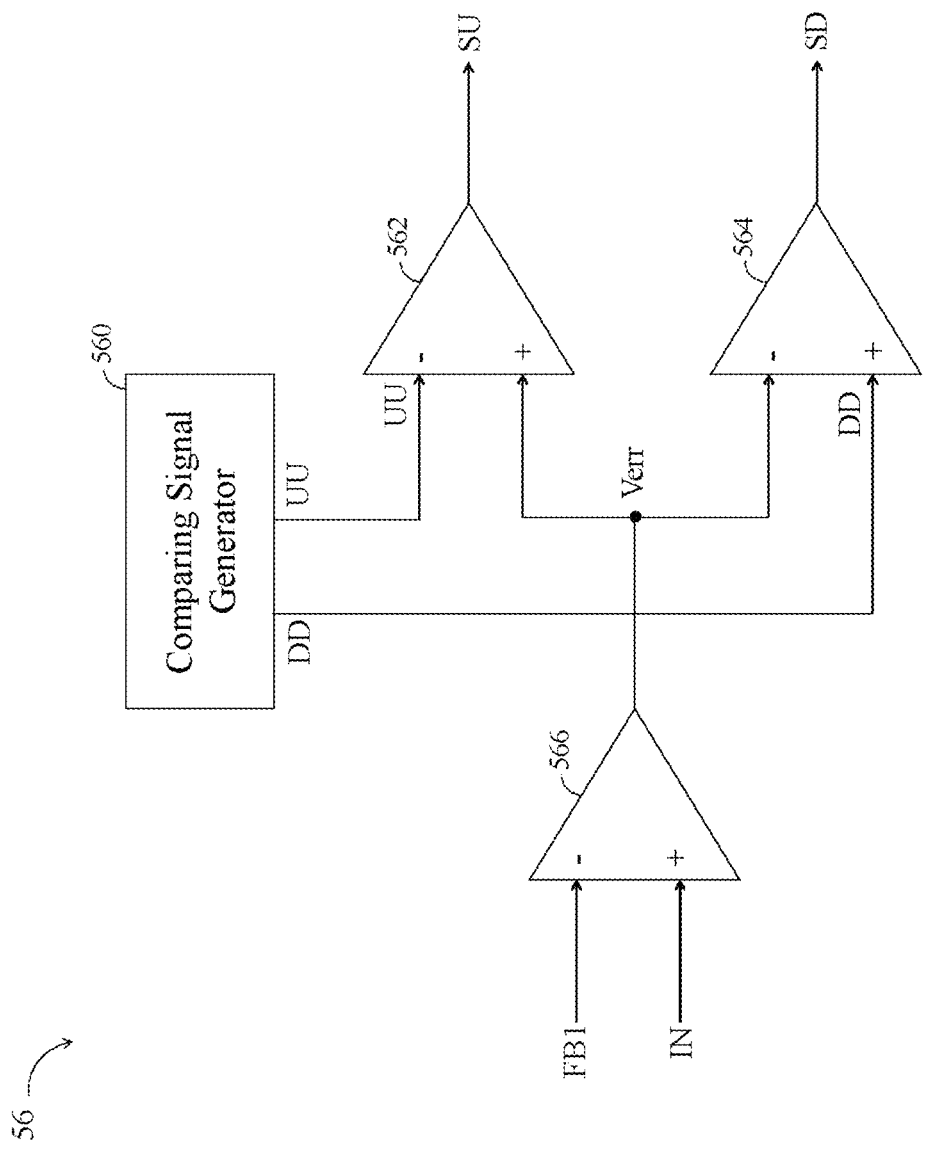
FIG. 5 is a schematic diagram of a pulse width modulation controller according to an embodiment of the present application.

The PWM controller is detailed as follows. FIG. 5 is a schematic diagram of a PWM controller 56 according to an embodiment of the present application. The PWM controller 56 may be used to realize the PWM controller 16. Comparing to the control mechanism of conventional class D amplifier, the PWM controller 56 generates two PWM signals instead of one. This is accomplished by a comparing signal generator 560, an error amplifying circuit 566 and two comparators 562 and 564.

The error amplifier 566 generates an error signal Verr from the input signal IN and the feedback signal FB1. In an embodiment, the positive input terminal of the error amplifier 566 receives the input signal IN and the negative input terminal of the error amplifier 566 receives the feedback signal FB1, but not limited thereto. In other word, without entering a saturation region of the error amplifier 566, the error signal Verr represents an amplified version of the error/difference (IN−FB1).

In an embodiment, the error amplifier 566 may be a differential amplifier comprising an operational amplifier or a differential transistor pair, but not limited thereto.

Figure 10:
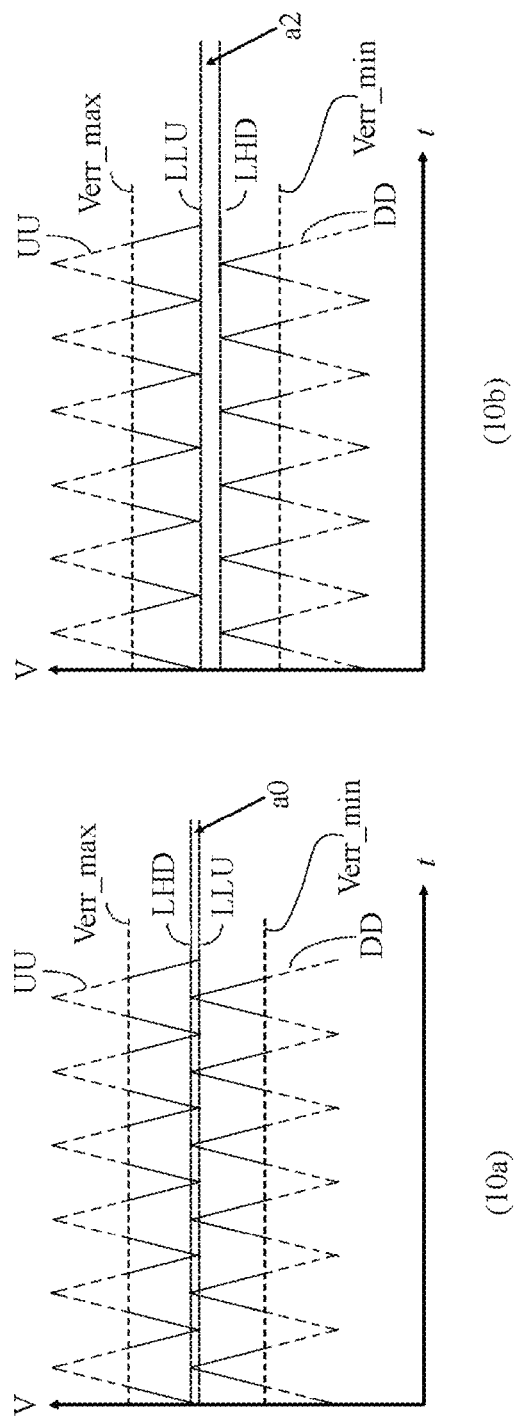
FIG. 10 illustrates waveforms of comparing signals according to embodiments of the present application.

The comparing signal generator 560 is configured to generate a first comparing signal UU and a second comparing signal DD. In an embodiment, the first comparing signal UU and the second comparing signal DD may have triangular (or sawtooth) waveforms. In an embodiment, the first comparing signal UU is simply an offset version of the second comparing signal DD, as shown in FIG. 10. That is, the first comparing signal UU may be expressed as UU=DD+Δ, where Δ represents the offset.

The comparator 562 compares the error signal Verr with the first comparing signal UU, to generate the first PWM signal SU; the comparator 564 compares the error signal Verr with the second comparing signal DD, to generate the second PWM signal SD. In an embodiment, a positive input terminal of the first comparator 562 receives the error signal Verr, and a negative input terminal of the first comparator 562 receives the first comparing signal UU; a negative input terminal of the second comparator 564 receives the error signal Verr, and a positive input terminal of the second comparator 564 receives the second comparing signal DD.

Figure 11:
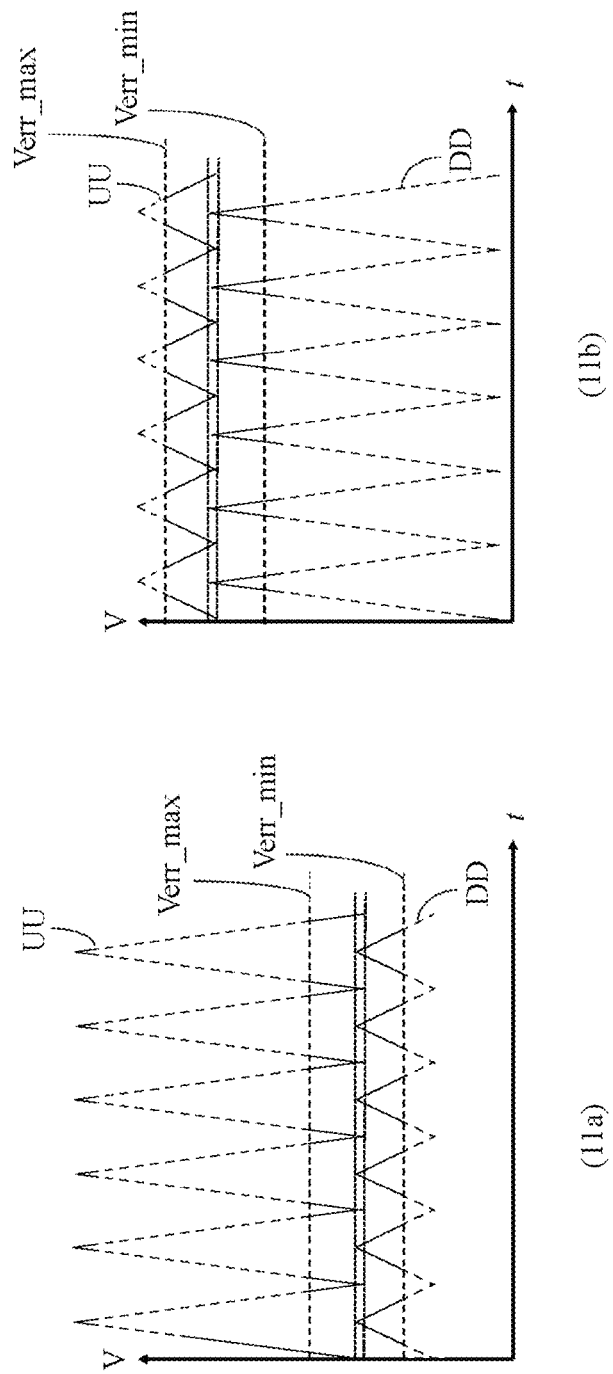
FIG. 11 illustrates waveforms of comparing signals according to embodiments of the present application.

In addition to the first comparing signal UU being simply an offset version of the second comparing signal DD, in an embodiment, the first comparing signal UU may be an offset-and-scaled version of the second comparing signal DD, and/or vice versa, as shown in FIG. 11. In other words, the comparing signal UU/DD may be expressed as UU=a·DD+Δ', where Δ' represents an offset, and a represents some scaling factor, which can be greater than 1 (i.e., a>1) or less than 1 (i.e., a<1). The value of the offset Δ/Δ' and the scaling factor a may be designed according to practical situation, which is also within the scope of the present application.

In an embodiment, the offset Δ may be designed such that the lowest (voltage) level LLU of the first comparing signal UU is less than the highest (voltage) level LHD of the second comparing signal DD, meaning that an overlapping region a0 between the lowest level LLU and the highest level LHD exists, as illustrated in FIG. 10a. In this case, when the error signal Verr is between the overlapping region, i.e., LLU<Verr<LHD, the comparator 562 would generate the PWM signal SU with low duty factor, and the comparator 564 would generate the PWM signal SD with low duty factor. Furthermore, pulse(s) PU of the PWM signal SU with low duty factor and pulse(s) PD of the PWM signal SD with low duty factor are temporally interleaved. The interleaved PWM signals SU and SD would produce small current flowing through the inductors L1 and L2. The small current (due to the interleaved pulse PU and PD) functions similar to the quiescent current of conventional class AB amplifier, and would help reduce the error or distortion (e.g., THD, total harmonic distortion) at the load 13.

Note that, in the driving circuits 10-40, the amount of transferred electronic charge Q during each cycle of PWM signal of a given duty cycle would depend on a voltage difference ΔV between the voltage source 11 and the load 13, where the voltage difference ΔV may be expressed as ΔV=|$V_S$−$V_L$|, where $V_S$ and $V_L$ are as labeled in FIG. 1~4. Indeed, the electronic charge Q transferred (per cycle of PWM signal of given duty cycle) has nonlinear relationship on the voltage difference ΔV. Furthermore, the relationships of the Q versus ΔV corresponding to the charging circuit and the discharging circuit have different/opposite trend of variation.

Figure 12:
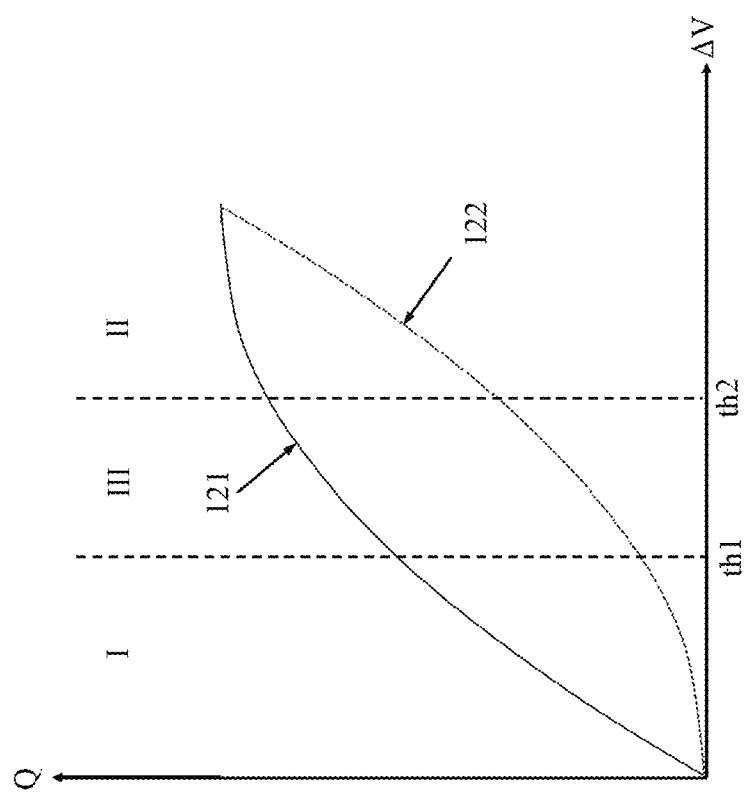
FIG. 12 illustrates curves of charge transferring capability of a charging circuit and a discharging circuit.

For example, FIG. 12 illustrates relationship of the transferred charge Q versus the voltage difference ΔV. A curve 121 represents the relationship of the transferred charge Q versus the voltage difference ΔV of the charging circuit 12 of FIG. 1 or the charging circuit 22 of FIG. 2, and a curve 122 represents which of the discharging circuit 14 of FIG. 1 or the discharging circuit 24 of FIG. 2. When ΔV approaches 0 or is less than a threshold th1, the slope of the curve 121 corresponding to the charging circuit is larger than the slope of the curve 122 curve to the discharging circuit. That is, when ΔV lies in a region I shown in FIG. 12, the charging circuit may be more sensitive (or have more charge transferring capability) than the discharging circuit. On the other hand, when the voltage difference ΔV is larger than a threshold th2, the slope of the curve 121 corresponding to the discharging circuit is larger than the slope of the curve 122 corresponding to the charging circuit. That is, when ΔV is sufficiently large or lies in a region II shown in FIG. 12, the discharging circuit may be more sensitive (or have more charge transferring capability) than the charging circuit. The sensitive and charge transferring capability herein can be evaluated by amount of transferred charge Q per voltage difference ΔV, or be represented as a tangent slope of the "Q vs. ΔV curve" (e.g., the curves 121 or 122) at some particular ΔV.

To compensate the imbalance of sensitivity or charge transferring capability between the charging and discharging circuits, disparity between pulse width of the pulse(s) PU of the PWM signal SU and pulse width of the pulse(s) PD of the PWM signal SD may be incorporated so as to neutralize the imbalance stated above. The disparity of pulse width may be adjusted according to the slope difference, e.g., the disparity of pulse width at certain ΔV increases as the difference of slopes between the curve 121 and the curve 122 increases.

The above can be achieved by properly design of the comparing signals UU and DD. For example, a spread of a tip of the triangular waveform may be narrowed when the sensitivity of the (dis)charging circuit is high, so as to decrease the pulse width of the PWM signal and shorten the (dis)charging time period within each (dis)charging cycle. On the other hand, a spread of a tip of the triangular waveform may be widened when the sensitivity of the (dis)charging circuit is low, so as to increase the pulse width of the PWM signal and lengthen the (dis)charging time period within each (dis)charging cycle.

In other words, for the same magnitude of error signal Verr, the PWM controller 16/56 may generate the PWM signal SU with the pulse PU when Verr<0 and generate the PWM signal SD with the pulse PD when Verr>0 where the pulse PU has a pulse width PWU and the pulse PD has a pulse width PWD and the pulse width PWU may be less than the pulse width PWD, i.e., PWU<PWD, when the charge transferring capability of the charging circuit corresponding to a ΔV (such as region I of FIG. 12) is stronger than which of the discharging circuit. On the contrary, for the same magnitude of error signal Verr, the pulse width PWU may be wider than the pulse width PWD, i.e., PWU>PWD, when the charge transferring capability of the charging circuit corresponding to a ΔV (such as the region II of FIG. 12) is weaker than which of the discharging circuit.

For example, waveforms of the comparing signals UU and DD illustrated in FIG. 11a, where, within the linear region between Verr_max and Verr_min, UU may be expressed as UU=a·DD+Δ' and a>1, may be applied (for the PWM controller 56) to the case when the sensitivity of the charging circuit is higher than which of the discharging circuit. That is, the waveforms of the signals UU and DD in FIG. 11a may be applied when ΔV lies in the region I shown in FIG. 12. On the other hand, waveforms of the comparing signals UU and DD illustrated in FIG. 11b, where UU may be expressed as UU=a·DD+Δ" and a<1, may be applied to the case when the sensitivity of the charging circuit is lower than which of the discharging circuit. That is, the waveforms of the signals UU and DD in FIG. 11b may be applied when ΔV lies in the region II shown in FIG. 12.

When ΔV lies in a region III in FIG. 12, in which the sensitivities of the charging circuit and the discharging circuit are more or less the same (meaning that the slope difference is less than a predefined threshold), the waveforms of the comparing signals UU and DD with equal amplitude illustrated in FIG. 10 may be applied. In other words, the scaling factor a may be chosen according to the voltage difference ΔV between the voltage source 11 and the load 13.

In an embodiment, given the supply voltage $V_S$ is usually constant, the scaling factor a may be chosen according to the load voltage $V_L$. In an embodiment, the comparing signal generator 560 may be coupled to the load 13 to receive the load voltage $V_L$ and determine the scaling factor a.

Note that, waveform of the first comparing signal UU and the second comparing signal DD is not limited to be triangular. Waveform of the first comparing signal UU and the second comparing signal DD may be truncated triangular (e.g., with flat top/bottom), trapezoid or other kinds of waveforms, depending on practical design criterion, which is also within the scope of the present application.

Figure 17:
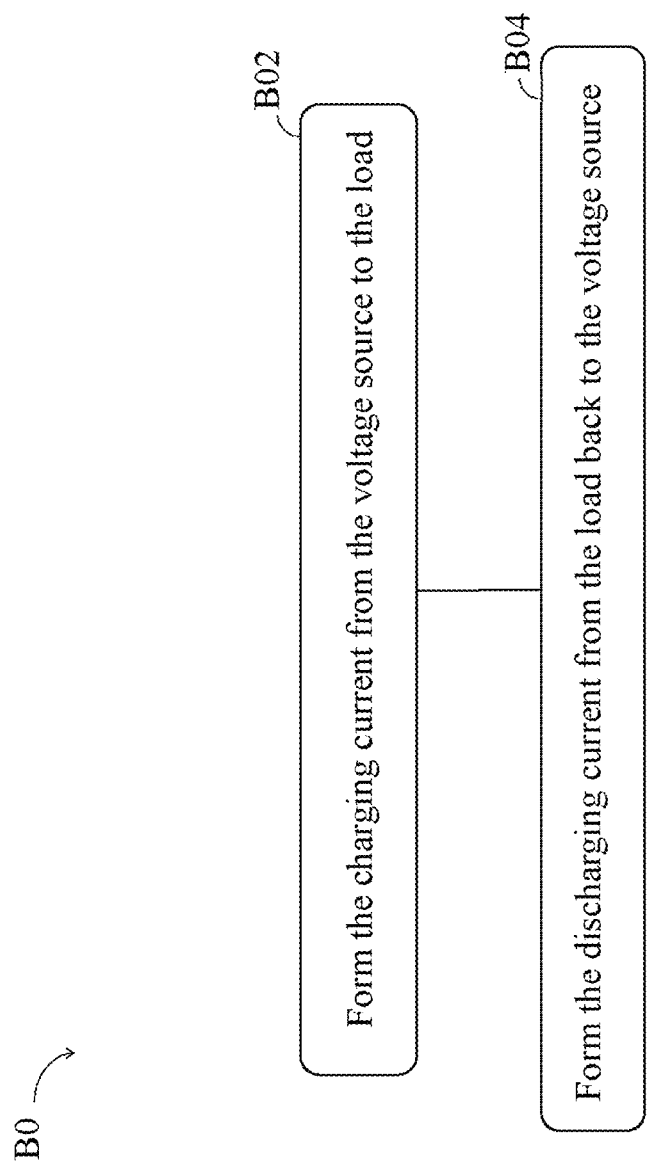
FIG. 17 is a schematic diagram of a process according to an embodiment of the present application.

Operations of the driving circuits 1040 can be summarized as a process BO, shown in FIG. 17. The process BO comprises the following steps.

Step B02: Form the charging current from the voltage source to the load.

Step B04: Form the discharging current from the load back to the voltage source.

Step B02 is performed by the charging circuit and Step B04 is performed by the discharging circuit. Details of Steps B02 and Step B04 may be referred to paragraphs stated in the above, which is not narrated herein for brevity.

Figure 6:
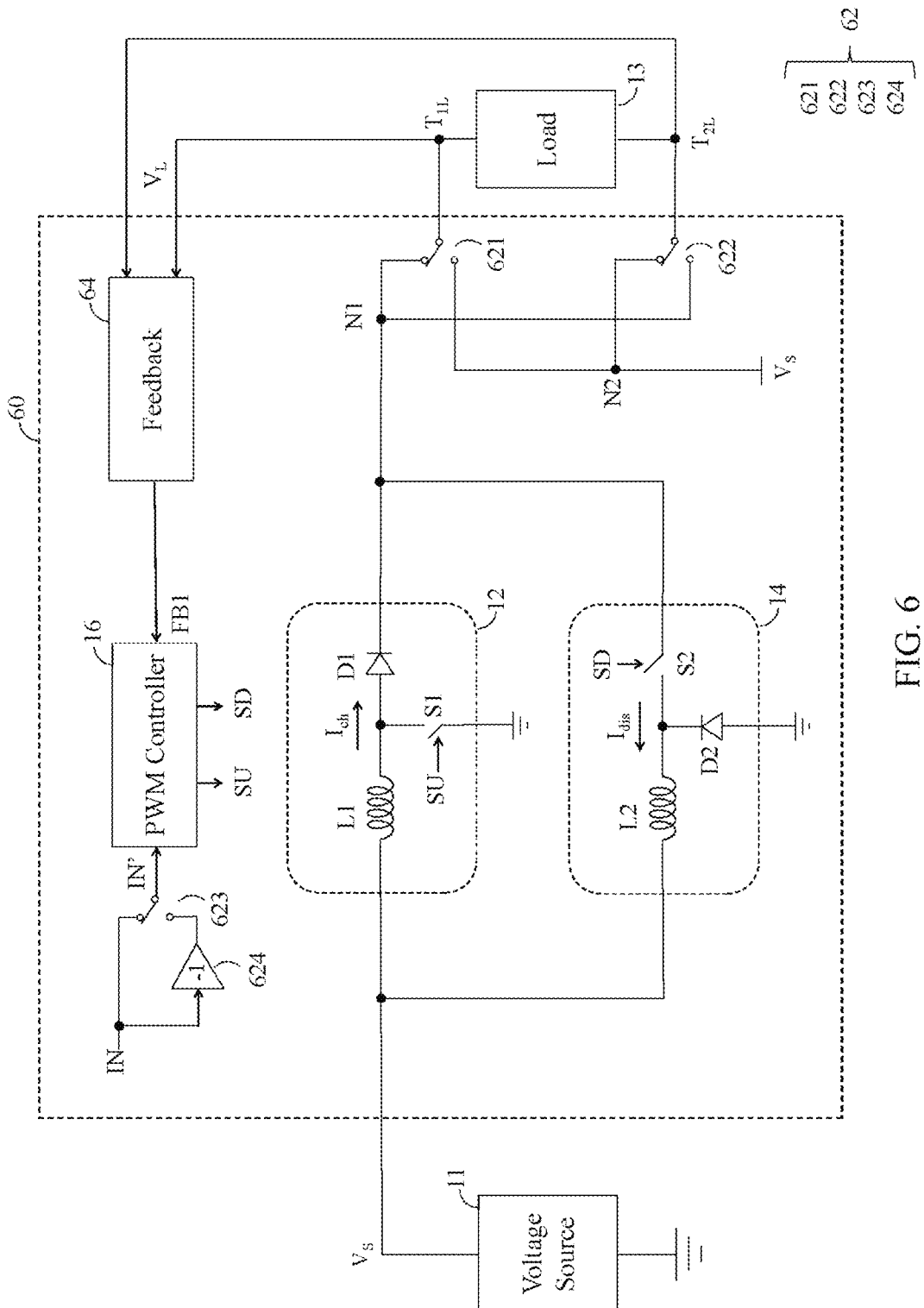
FIG. 6 is a schematic diagram of a driving circuit according to an embodiment of the present application.

In addition, a BTL-like (BTL: bridge-tied-load) effect may be incorporated into the driving circuit of the present application. For example, FIG. 6 is a schematic diagram of a driving circuit 60 according to an embodiment of the present application. The driving circuit 60 is similar to the driving circuit 10, and thus, same components are annotated by same notations. Different from the driving circuit 10, the driving circuit 60 further comprises a polarity toggle module 62. The polarity toggle module 62 receives the input signal IN and produces an input signal IN' to the PWM controller 16.

A polarity of the input signal IN with respect to a voltage $V_{AC,\ 0V}$ would be determined. The input signal IN is determined as "positive" when the input signal IN is greater than the voltage $V_{AC,\ 0V}$, and determined as "negative" when the input signal IN is less than the voltage $V_{AC,\ 0V}$. The voltage $V_{AC,\ 0V}$, based on which the polarity of the input signal IN is determined, may be chosen according to practical situation. In an aspect, the voltage $V_{AC,\ 0V}$ may be regarded as a ground voltage for an AC (Alternating Current) signal. In an embodiment, the voltage $V_{AC,\ 0V}$ may be a kind of average of the input signal IN. In embodiments where input signal IN is digital in 2's compliment format, $V_{AC,\ 0V}$ will simply correspond to "0".

Figure 13:
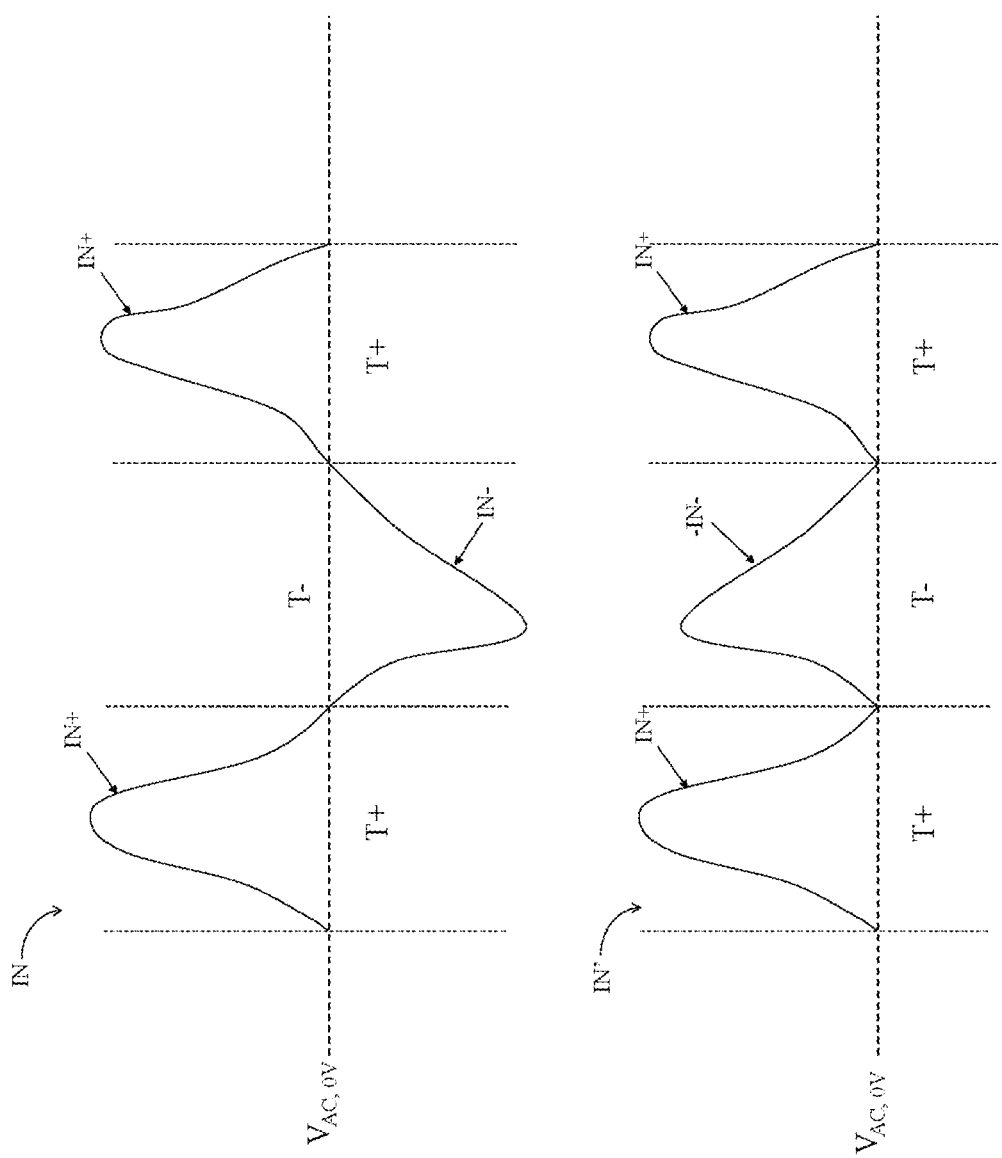
FIG. 13 illustrates waveforms of input signals according to an embodiment of the present application.

Referring to both FIG. 6 and FIG. 13, where FIG. 13 illustrates a waveform of the input signal IN in the upper portion and a waveform of the input signal IN' in the lower portion. When the input signal IN is positive, denoted as IN+ in FIG. 13, during one of the T+ time intervals shown in the IN waveform of FIG. 13, the input signal waveform IN is duplicated in waveform IN' and is fed to the polarity toggle module 62 such that the PWM controller 16 generates the PWM signal SU/SD according to the signal IN+. In this case, a first terminal of the load 13 (denoted as $T_{1L}$ in FIG. 6) is connected to a first node N1, and a second terminal of the load 13 (denoted as $T_{2L}$ in FIG. 6) is connected to a second node N2. When the input signal IN is negative, denoted as IN– in the IN waveform of FIG. 13, during the T– time interval of FIG. 13, the polarity toggle module 62 produces an inverted version of the input signal IN, denoted as —IN–, such that the PWM controller 16 generates the PWM signals SU/SD according to —IN– while the first terminal $T_{1L}$ is connected to the second node N2, and the second terminal $T_{2L}$ is connected to the first node N1.

In the embodiment illustrated in FIG. 6, the nodes N1 and N2 are referred to two terminals of the (dis)charging circuit, which is not limited thereto. As long as a polarity of voltage applied on/over the load 13 (or simply a polarity of the load 13) is reversed/swapped whenever the input signal IN changes its sign (or crosses the voltage $V_{AC, ov}$), the requirement of the present application is satisfied, which is within the scope of the present application.

As shown in FIG. 6, the polarity toggle module 62 comprises a first toggle switch 621, a second toggle switch 622, a third toggle switch 623 and an inverter 624. The toggle switch 621 connects the terminal $T_{1L}$ and the nodes N1 and N2. The toggle switch 622 connects the terminal $T_{2L}$ and the nodes N1 and N2. The third toggle switch 623 is coupled to the inverter 624. The inverter 624 is configured to generate inverted version of the input signal IN. In the event where input signal IN is in digital format, the function of switch 623 and inverter 624 may be replaced by a mathematic "absolute" operator.

Operations of the polarity toggle module 62 are iterated as follows. When the input signal IN is positive (or during the time interval T+), the toggle switch 623 outputs the input signal IN (i.e., the positive portion IN+) to the first input terminal of the PWM controller 16, the toggle switch 621 conducts a connection between the first terminal $T_{1L}$ of the load 13 and the first node N1, and the second toggle switch 622 conducts a connection between the second terminal $T_{2L}$ of the load 13 and the second node N2. When the input signal IN is negative (or during the time interval T–), the toggle switch 623 outputs an inverted version of the input signal IN (i.e., an inverted version of the negative portion IN–, denoted as —IN–) to the first input terminal of the PWM controller 16, the toggle switch 621 conducts a connection between the first terminal $T_{1L}$ of the load 13 and the second node N2, and the second toggle switch 622 conducts a connection between the second terminal $T_{2L}$ of the load 13 and the first node N1.

The signal received at the first input terminal of the PWM controller 16 is denoted as IN'. The input signal IN' comprises the positive portion IN+ during the time intervals T+ and the inverted negative portion —IN– during the time intervals T–, as shown in FIG. 13.

In an embodiment, each of the toggle switches 621-623 may be realized by a SPDT (Single Pole Double Throw) switch. In an embodiment, by proper routing, all of three toggle switches 621-623 may be combined into one 3PDT (Three Pole Double Throw) switch.

In addition, the polarity toggle module 62 may comprise a sign detector (not shown in FIG. 6). The sign detector is configured to determine the polarity of the input signal IN and to generate an output signal, so as to control the toggle switches 621-623. In an embodiment, the toggle switches 621-623 may be controlled by a control signal, and the control signal may be synchronized with the output signal of the sign detector. In the present application, two signals being synchronized indicates that rising/falling edges of the two signals are temporally aligned. In another embodiment, the toggle switches 621-623 may be controlled by control signals ctr1-ctr3, respectively, and the control signals ctr1-ctr3 are all synchronized with the output signal of the sign detector.

In an embodiment, the sign detector may be realized by a comparator with a first input terminal receiving the input signal IN, a second input terminal receiving the voltage $V_{AC, ov}$, and an output terminal outputting the output signal.

In an embodiment, the second node N2 may receive the supply voltage $V_S$. In an embodiment, the second node N2 may be connected to the voltage source 11 to receive the supply voltage $V_S$.

In addition, the driving circuit 60 may comprise a differential feedback circuit 64. In an embodiment, the feedback circuit 64 may comprise a differential amplifier with a voltage divider at input stage, which is to produce the feedback signal FB1 as FB1=r·$V_L$, where $V_L$ herein represents a voltage difference across terminals $T_{1L}$ and $T_{2L}$. In an embodiment, the feedback circuit 64 may be realized by resistors or capacitors, which is not limited thereto. Note that, the feedback circuit as the voltage divider may also be applied to the driving circuits 10-40 between the load 13 and the PWM controller 16, which is not limited thereto.

The benefit of the BTL-like driving circuit 60 is to enlarge (or double) the overall voltage swing applied across the load 13, given certain breakdown voltage of the charging/discharging circuit. In other words, supposed that the charging circuit 12 and the discharging circuit 14 are fabricated by the process with the same breakdown voltage (denoted as $V_B$) for both the driving circuits 10 and 60, the peak-to-peak voltage over the load 13 in circuit 60 of FIG. 6 may achieve as 2·$V_B$, i.e., twice of the circuit 10 of FIG. 1. In addition to doubling the driving voltage range, the efficiency of the charging/discharging circuit will also be enhanced.

Figure 7:
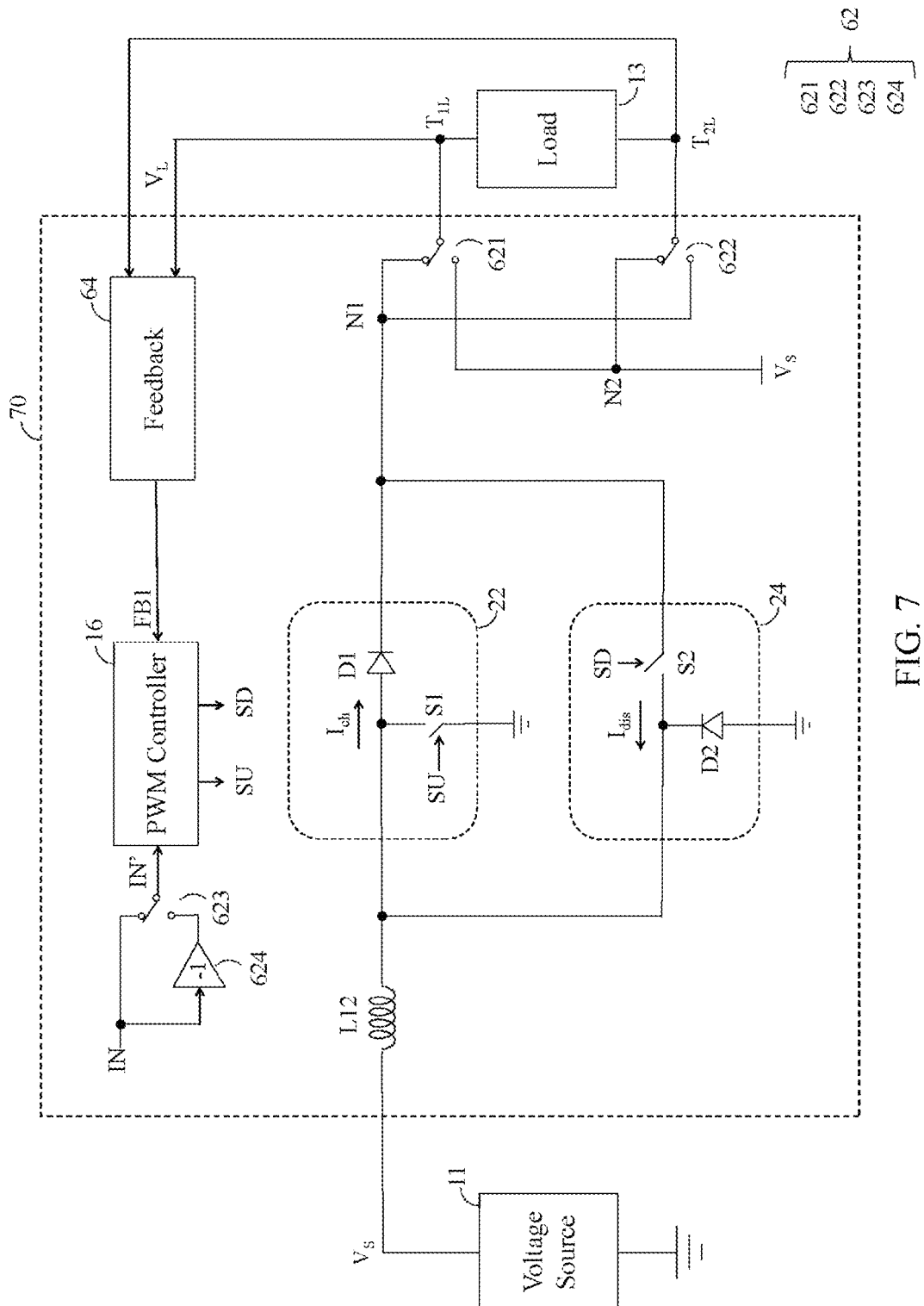
FIG. 7 is a schematic diagram of a driving circuit according to an embodiment of the present application.

Similarly, the BTL-like topology using the polarity toggle module 62 may be applied to the driving circuits 20, 30 and 40. For example, FIG. 7 is a schematic diagram of a driving circuit 70 according to an embodiment of the present application. The driving circuit 70 is similar to the driving circuit 20. Different from the driving circuit 20, the polarity toggle module 62 is applied.

In another perspective, it happens that the PWM signals SU and SD may be at a low state at the same time, causing the switches S1 and S2 both being turned off during a switching cycle. Referring to FIG. 10b as an example, if the offset A is designed such that the lowest (voltage) level LLU of the first comparing signal UU is greater than the highest (voltage) level LHD of the second comparing signal DD, which means that a nonoverlapping gap a2 between the highest (voltage) level LHD of the second comparing signal DD and the lowest (voltage) level LLU of the first comparing signal UU exists, as illustrated in FIG. 10b. When the error signal Verr is within the range of nonoverlapping gap a2, i.e., LLU>Verr>LHD, both the PWM signals SU and SD would be at the low state, and the switches S1 and S2 would both be off during a switching cycle. Similar to conventional class B amplifier, the simultaneously turn-off switches S1 and S2 may cause some error at the terminal $T_{1L}$ and produce some total harmonic distortion (THD).

Note that, in an embodiment, the portion of comparing signal UU and DD outside of the linear range of Verr (between Verr_max and Verr_min), illustrated as dashed lines in FIG. 10 and FIG. 11, do not serve any practical purpose and need not be generated.

Figure 8:
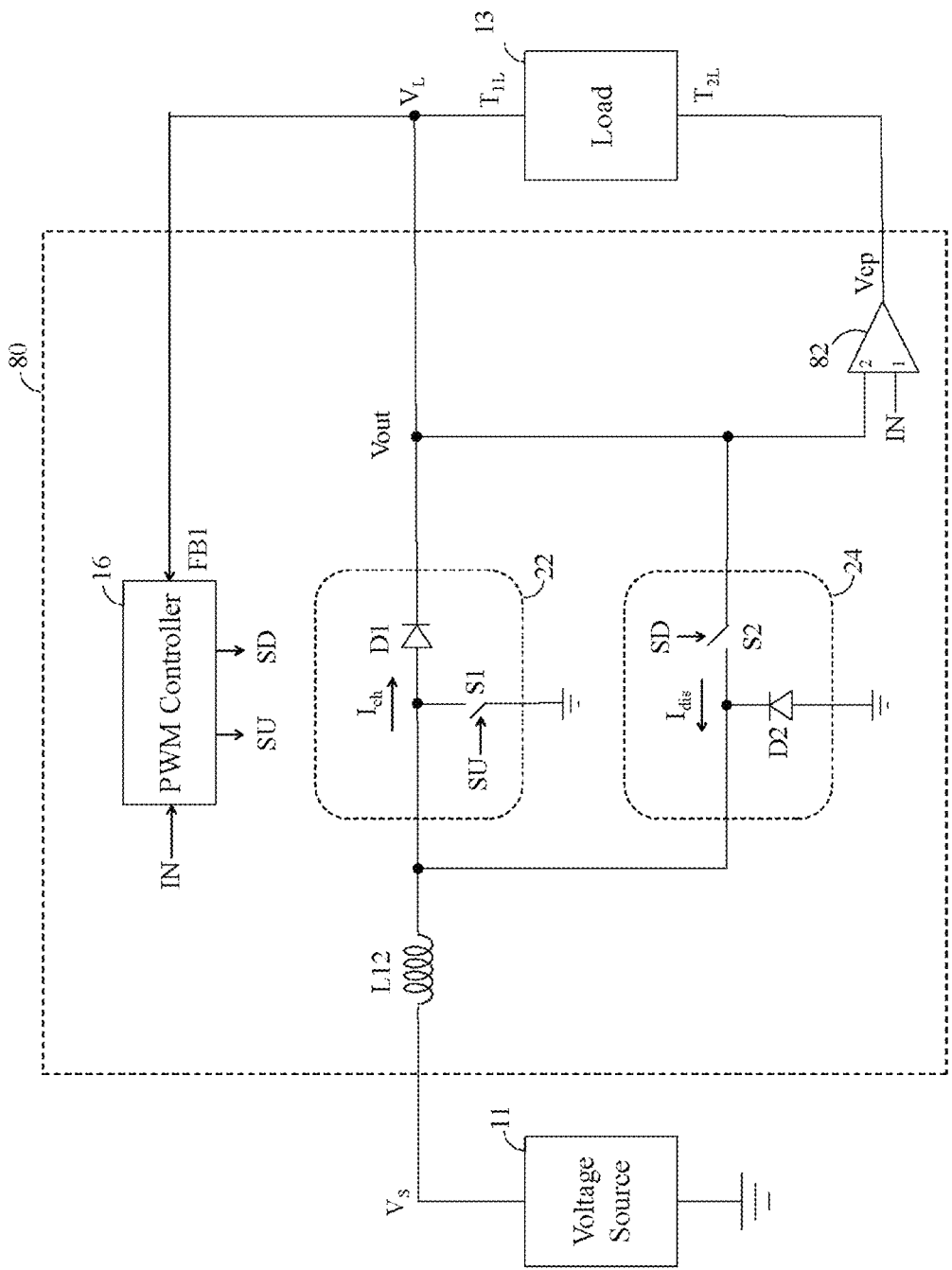
FIG. 8 is a schematic diagram of a driving circuit according to an embodiment of the present application.

To alleviate the error at the terminal $T_{1L}$ and the THD, an auxiliary amplifier may be employed to drive the terminal $T_{2L}$. FIG. 8 is a schematic diagram of a driving circuit 80 according to an embodiment of the present application. The driving circuit 80 is similar to the driving circuit 20. Different from the driving circuit 20, the driving circuit 80 is further comprises an auxiliary amplifying circuit 82. A first input terminal of the auxiliary amplifying circuit 82 (annotated by "1"), detailed in FIG. 14, receives the input signal IN. A second input terminal (annotated by "2") of the auxiliary amplifying circuit 82 is coupled to the first terminal $T_{1L}$ of the load 13. An output terminal of the auxiliary amplifying circuit 82 is coupled to the second terminal $T_{2L}$ of the load 13.

It can be regarded that, in the driving circuit 80, the charging circuit 22 and the discharging circuit 24 would produce an output voltage Vout, and the auxiliary amplifying circuit 82 would generate a compensation voltage Vcp. The output voltage Vout is applied to the first terminal $T_{1L}$ of the load 13, and the compensation voltage Vcp is applied to the second terminal $T_{2L}$ of the load 13.

Note that, the charging and discharging circuits with the PWM controller in the driving circuit 80 may be viewed as a wide dynamic range, high efficiency but low resolution amplifying circuit, while the auxiliary amplifying circuit 82 may be viewed as a low dynamic range, low efficiency but high resolution amplifying circuit. In other words, the resolution of the compensation voltage Vcp is higher/finer than the resolution of the output voltage Vout, a range of peak-to-peak voltage swing of the compensation voltage Vcp is smaller than a range of peak-to-peak voltage swing of output voltage Vout, and an efficiency of the resulting amplifying circuit (comprising the charging circuit and the discharging circuit) is higher than the auxiliary amplifying circuit 82. When the resulting amplifying circuit and the auxiliary amplifying circuit 82 are combined together as illustrated in FIG. 8, the driving circuit 80 will benefit from the wide dynamic range and high efficiency of the PWM controlled charging circuit 22 and discharging circuit 24 while attain the high resolution of the auxiliary amplifying circuit 82.

Note that, employing the charging circuit 22 and the discharging circuit 24 in FIG. 8 is for illustrative purpose, the driving circuit comprising the auxiliary amplifying circuit 82 may employ the charging circuit 12/32/42 and the discharging circuit 14/34/44, which is also within the scope of the present application.

Figure 9:
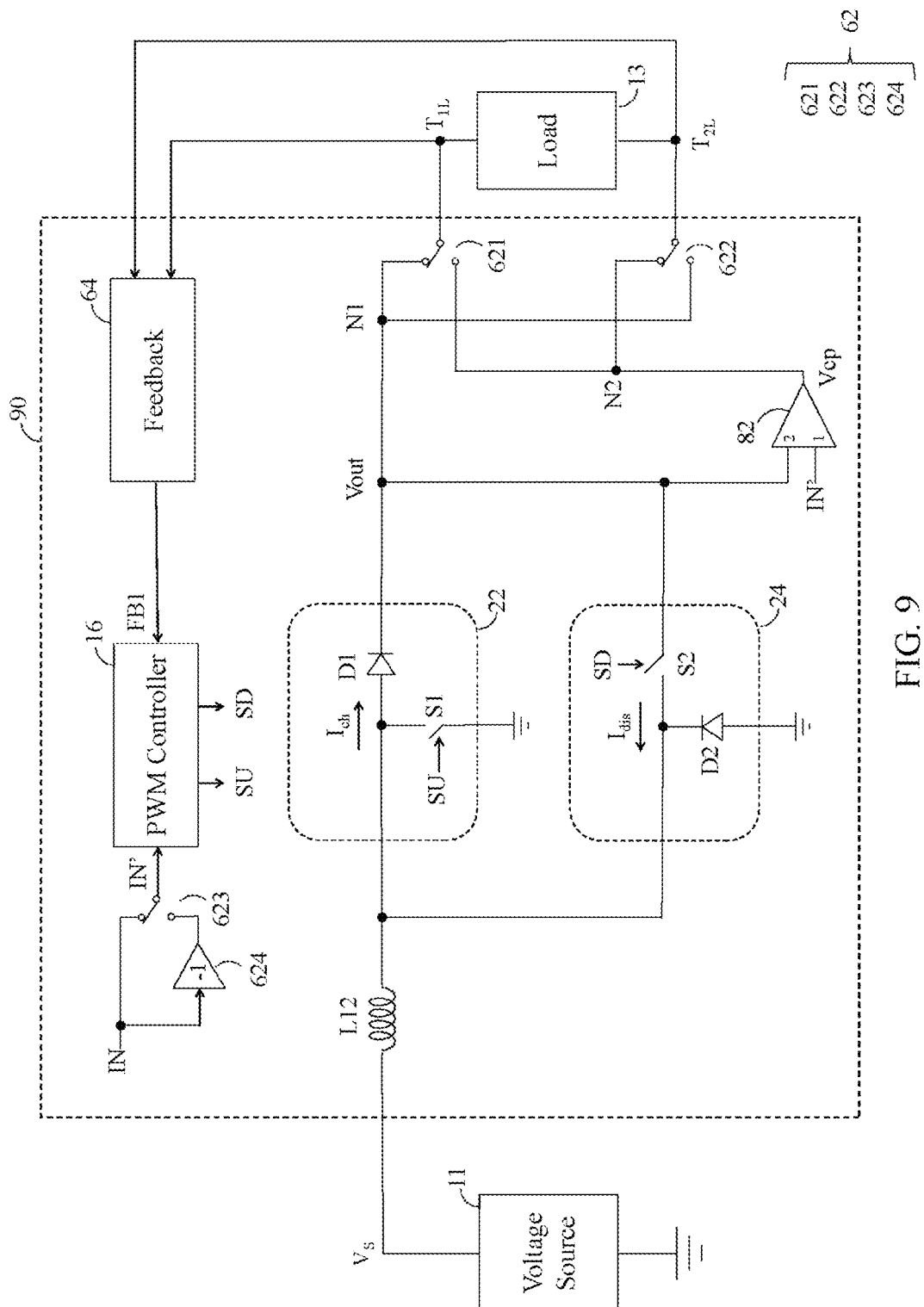
FIG. 9 is a schematic diagram of a driving circuit according to an embodiment of the present application.

Similarly, the auxiliary amplifying circuit 82 may be applied to other driving circuits of the present application. For example, FIG. 9 is a schematic diagram of a driving circuit 90 according to an embodiment of the present application. The driving circuit 90 is similar to the driving circuits 70 and 80. Different from the driving circuit 70, the auxiliary amplifying circuit 82 is applied. Different from the driving circuit 80, the first input terminal of the auxiliary amplifying circuit 82 (annotated by "1") in circuit 90 receives the input signal IN', the second input terminal of the auxiliary amplifying circuit 82 (annotated by "2") in circuit 90 is coupled to the first node N1, and the output terminal of the auxiliary amplifying circuit 82 is coupled to the second node N2.

Figure 14:
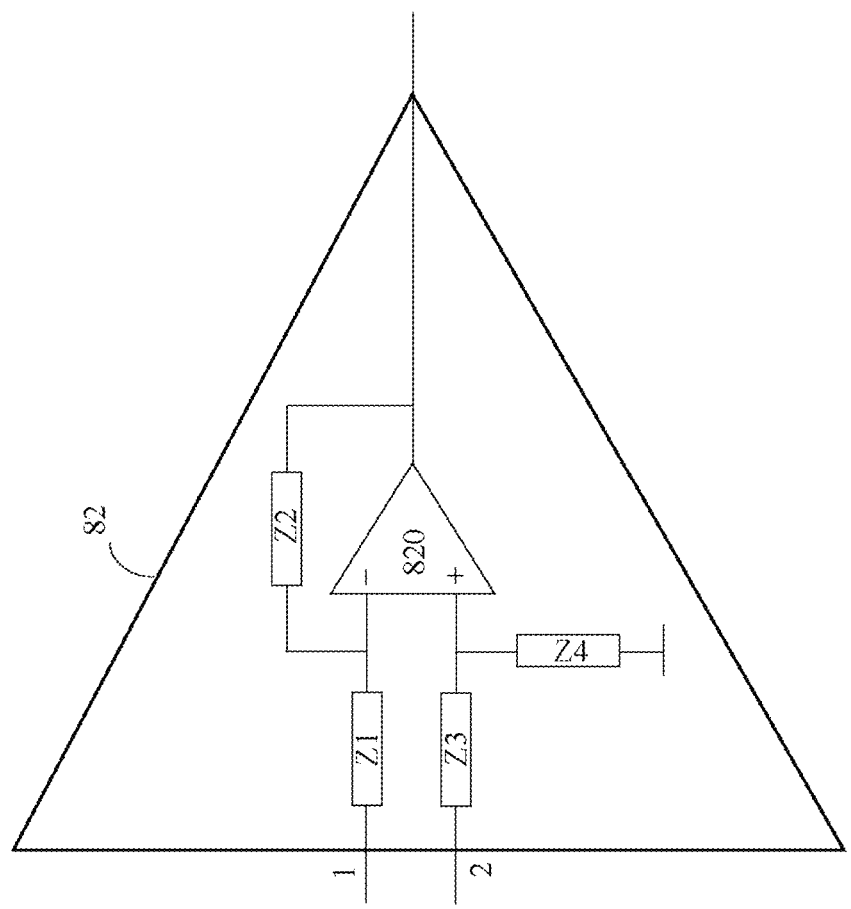
FIG. 14 is a schematic diagram of an auxiliary amplifying circuit according to an embodiment of the present application.

FIG. 14 illustrates an embodiment of the auxiliary amplifying circuit 82. As FIG. 14 shows, the auxiliary amplifying circuit 82 may comprise an amplifier 820 (which may be an operational amplifier) and impedance components Z1~Z4. The impedance components Z1~Z4 may be resistors or capacitors. The value Z1~Z4 may be chosen such that amplifier 820 produces output equal to the error at node $V_L$. For example, $Z3/Z4=Z2/Z1=r$, where r is the ideal ratio between $V_L$/IN when the error $\varepsilon$ at $V_L$ is zero, and $\varepsilon=V_L - r \cdot IN$. If the output amplifier 820 matches $\varepsilon$ perfectly, then the voltage across loading 13 equals $V_L - V_{820} = V_L - \varepsilon = V_L - (V_L - r \cdot IN) = r \cdot IN$ which is the perfect result. Therefore, the resolution of circuit 80 will be determined by the resolution of amplifier 820, while the output voltage swing range of amplifier 820 (dynamic range) equals to the range of E.

Notably, the embodiments stated in the above are utilized for illustrating the concept of the present application. Those skilled in the art may make modifications and alterations accordingly, and not limited herein. For example, bias/offset voltage may be adequately added to nodes/terminals in the driving circuit, the voltage source and the load to obtain a better operation (bias) point. For example, a bias voltage may be applied to one of the electrodes of the actuator within the load 13 (if the load 13 comprises piezoelectric actuated speaker), to move the actuator to an operation region of better linearity. Bias voltages may be applied to nodes/terminals to obtain better dynamic range, voltage comparison basis, etc., which is also within the scope of the present application.

In addition, the switches S1 and S2 may be realized by proper type of transistors. The diodes D1 and D2 may be simply diode with single PN junction, transistor with proper wiring configuration or be replaced by synchronous switch/MOSFET controlled by suitable gate drive signal.

The diodes D1 and D2 play a role of limiting a current flowing therethrough in a direction (but not in its opposite direction), which can be regarded as a kind of rectifying component. Note that, it is not limited to using diode as rectifying component. As mentioned earlier, synchronous rectifier (SR) comprising rectifying switch controlled by synchronous signal may also be used as rectifying component.

Figure 16:
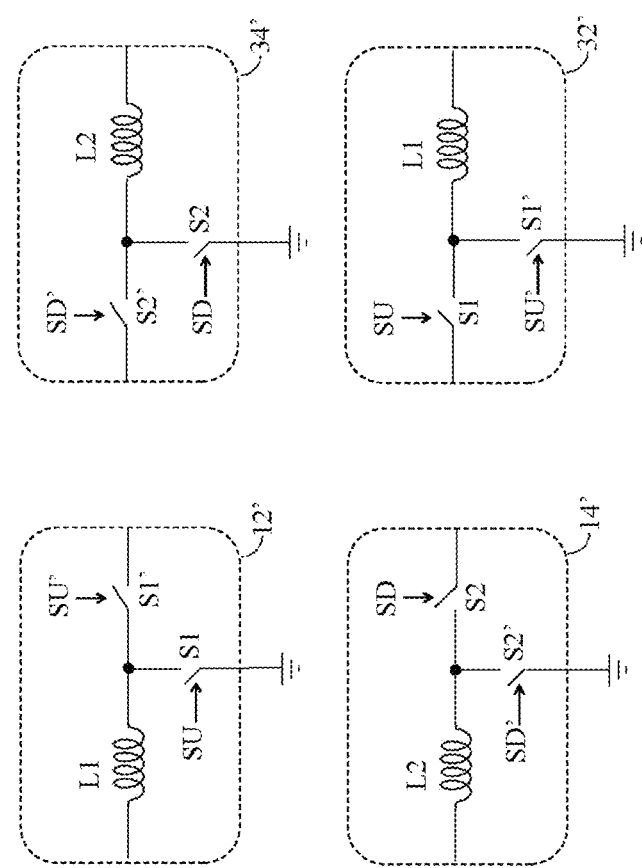
FIG. 16 illustrates charging circuits and discharging circuits according to embodiments of the present application.

For example, FIG. 16 illustrates charging circuits 12', 32' and discharging circuits 14', 34'. The charging circuits 12', 32' and discharging circuits 14', 34' may be applied to the driving circuit of the present application. The charging circuits 12' and 32' are obtained by replacing the diode D1 by a rectifying switch S1' controlled by a synchronous signal SU' (as FIG. 16 shows). The rectifying switch S1' and the synchronous signal SU' form a synchronous rectifier. The synchronous rectifier is known in the art. The rectifying switch S1' may be turned ON when current flowing therethrough is in the desired direction, and should be turned OFF before the current direction flips. Similarly, the discharging circuits 14' and 34' are obtained by replacing the diode D2 by a rectifying switch S2' controlled by a synchronous signal SD'. Similar to the diode D1/D2, by designing control signals SU'/SD' properly, the rectifying switch S1'/S2' is also able to allow current flowing through in a certain direction and reject current flowing through the opposite direction.

In other words, the diodes and the SRs, comprising rectifying switch controlled by synchronous signal (as illustrated in FIG. 16), can be treated as two different realizations/embodiments of the rectifying component. Using SR is also within the scope of present application. Furthermore, in some embodiment, the diode and the SR may be both employed within one single (dis)charging circuit, which is also within the scope of present application.

Figure 15:
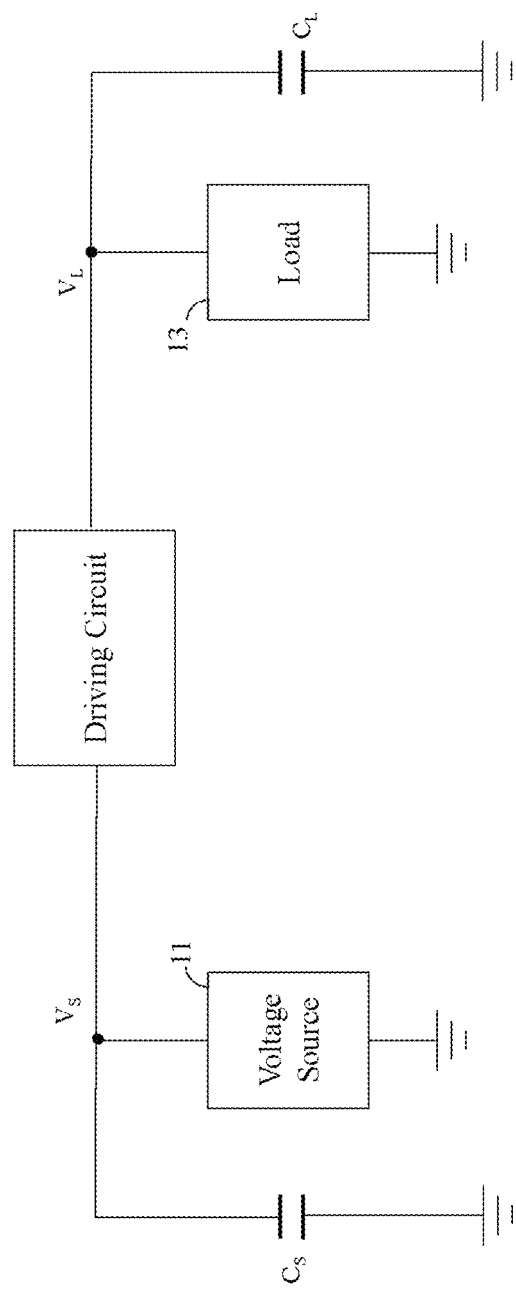
FIG. 15 is a schematic diagram of a source bypass capacitor and a load bypass capacitor according to an embodiment of the present application.

In an embodiment, a load bypass capacitor $C_L$, connected to the first terminal $T_{1L}$ of the load 13 and a ground terminal, may be included, to enhance the efficiency and the stability of the driving circuits of the present application. In addition, a source bypass capacitor $C_S$, connected to the voltage source 11 and the ground terminal, may be included, to reduce voltage fluctuation(s) of $V_S$. Illustratively, a source bypass capacitor $C_S$ and the load bypass capacitor $C_L$ are shown in FIG. 15, which is within the scope of the present application.

Note that, the driving circuit of the present application is suitable for capacitive speaker load, but not limited thereto. The driving circuit of the present application may be applied to drive different kind of capacitive load, other than the speaker.

In summary, the present application utilizes a DC-DC converter circuit to function as charging circuit to charge up the capacitive load; utilizes another DC-DC converter circuit to function as discharging circuit to recycle the energy stored in the capacitive load; utilizes the PWM controller to compensate the imbalance of the charge transferring capability of the charging circuit and the discharging circuit; utilizes the toggle module to realize the BTL-like topology; utilizes the auxiliary amplifying circuit with high resolution to mitigate THD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit, configured to drive a load, comprising:
   a charging circuit, controlled by a first pulse width modulation (PWM) signal, coupled between a voltage source and the load, configured to form a first current from the voltage source to the load;
   a discharging circuit, controlled by a second PWM signal, coupled between the voltage source and the load, configured to form a second current from the load back to the voltage source; and
   a PWM controller, receiving an input signal and coupled to the load so as to receive a feedback signal, configured to generate the first PWM signal and the second PWM signal according to the input signal and the feedback signal;
   wherein the PWM controller controls the charging circuit and the discharging circuit via the first and second PWM signals, such that the first current is formed during a first interval corresponding to an upswing portion of the input signal and the second current is formed during a second interval corresponding to a downswing portion of the input signal;
   wherein the load is a capacitive load;
   wherein the second current is configured to recycle an energy stored within the capacitive load back to the voltage source.

2. The driving circuit of claim 1, wherein
   the charging circuit comprises a first switch and a first rectifying component;
   the discharging circuit comprises a second switch and a second rectifying component.

3. The driving circuit of claim 2, wherein
   a first terminal of the first rectifying component is coupled to the voltage source, a second terminal of the first rectifying component is coupled to the load;
   a first terminal of the first switch is coupled to the first terminal of the first rectifying component;
   a first terminal of the second switch is coupled to the voltage source and a second terminal of the second switch is coupled to the load;
   a first terminal of the second rectifying component is coupled to the first terminal of the second switch.

4. The driving circuit of claim 3, wherein
   the charging circuit comprises a first inductor, a first terminal of the first inductor is coupled to the voltage source, a second terminal of the first inductor is coupled to the first terminal of the first rectifying component and the first terminal of the first switch;
   the discharging circuit comprises a second inductor, a first terminal of the second inductor is coupled to the voltage source, a second terminal of the second inductor is coupled to the first terminal of the second rectifying component and the first terminal of the second switch.

5. The driving circuit of claim 3, further comprising an inductor, wherein a first terminal of the inductor is coupled to the voltage source, and a second terminal of the inductor is coupled to the first terminal of the first rectifying component, the first terminal of the first switch, the first terminal of the second rectifying component and the first terminal of the second switch.

6. The driving circuit of claim 2, wherein
   a first terminal of the first switch is coupled to the voltage source and a second terminal of the first switch is coupled to the load;
   a first terminal of the first rectifying component is coupled to the second terminal of the first switch;
   a first terminal of the second rectifying component is coupled to the voltage source, a second terminal of the second rectifying component is coupled to the load;
   a first terminal of the second switch is coupled to the second terminal of the second rectifying component.

7. The driving circuit of claim 6, wherein
   the charging circuit comprises a first inductor, a first terminal of the first inductor is coupled to the first terminal of the first rectifying component and the second terminal of the first switch, a second terminal of the first inductor is coupled to the load;
   the discharging circuit comprises a second inductor, a first terminal of the second inductor is coupled to the second terminal of the second rectifying component and the first terminal of the second switch, a second terminal of the second inductor is coupled to the load.

8. The driving circuit of claim 6, further comprising an inductor, wherein a first terminal of the inductor is coupled to the first terminal of the first rectifying component, the second terminal of the first switch, the second terminal of the second rectifying component and the first terminal of the second switch, and a second terminal of the inductor is coupled to the load.

9. The driving circuit of claim 2, wherein the first rectifying component comprises a first diode.

10. The driving circuit of claim 2, wherein the first rectifying component comprises a rectifying switch controlled by a synchronous signal.

11. The driving circuit of claim 2, wherein the second rectifying component comprises a second diode.

12. The driving circuit of claim 2, wherein the second rectifying component comprises a rectifying switch controlled by a synchronous signal.

13. The driving circuit of claim 2, wherein the first switch is controlled by the first PWM signal, the second switch is controlled by the second PWM signal, and the PWM controller comprises:
   a first input terminal, receiving a first input signal; and
   a second input terminal, coupled to the load to receive a first feedback signal;

wherein the PWM controller is configured to generate the first PWM signal and the second PWM signal according to the first input signal and the first feedback signal.

14. The driving circuit of claim 1, wherein the PWM controller comprises:
   a comparing signal generator, configured to generate a first comparing signal and a second comparing signal;
   an error amplifier, configured to generate an error signal according to the first input signal and the first feedback signal;
   a first comparator, configured to generate the first PWM signal by comparing the first comparing signal and the error signal; and
   a second comparator, configured to generate the second PWM signal by comparing the second comparing signal and the error signal.

15. The driving circuit of claim 14, wherein
   a positive input terminal of the first comparator receives the error signal;
   a negative input terminal of the first comparator receives the first comparing signal;
   a negative input terminal of the second comparator receives the error signal; and
   a positive input terminal of the second comparator receives the second comparing signal.

16. The driving circuit of claim 14, wherein the first comparing signal is an offset version or a scaled-and-offset version of the second comparing signal.

17. The driving circuit of claim 16, wherein the scaled-and-offset version is corresponding to a scaling factor, the scaling factor is determined according to a load voltage, and the comparing signal generator is coupled to the load to receive the load voltage.

18. The driving circuit of claim 14,
   wherein the first PWM signal comprises a first pulse, the first pulse has a first pulse width;
   wherein the second PWM signal comprises a second pulse, the second pulse has a second pulse width;
   wherein the charging circuit has a first sensitivity corresponding to a voltage difference between a supply voltage and a load voltage;
   wherein the discharging circuit has a second sensitivity corresponding to the voltage difference;
   wherein the first pulse width is narrower than the second pulse width when the first sensitivity is higher than the second sensitivity.

19. The driving circuit of claim 14,
   wherein the first PWM signal comprises a first pulse, the first pulse has a first pulse width;
   wherein the second PWM signal comprises a second pulse, the second pulse has a second pulse width;
   wherein the charging circuit has a first sensitivity corresponding to a voltage difference between a supply voltage and a load voltage;
   wherein the discharging circuit has a second sensitivity corresponding to the voltage difference;
   wherein the first pulse width is wider than the second pulse width when the first sensitivity is lower than the second sensitivity.

20. The driving circuit of claim 14, wherein the first comparing signal and the second comparing signal have triangular or trapezoid waveform.

21. The driving circuit of claim 13, further comprising a polarity toggle module;
   wherein when a second input signal is positive, the polarity toggle module is controlled such that the PWM controller generates the first and second PWM signals according to a positive portion of the second input signal, a first terminal of the load is connected to a first node, and a second terminal of the load is connected to a second node;
   wherein when the second input signal is negative, the polarity toggle module is controlled such that the PWM controller generates the first and second PWM signals according to a negative portion of the second input signal, the first terminal of the load is connected to the second node, and the second terminal of the load is connected to the first node.

22. The driving circuit of claim 21, wherein the polarity toggle module comprises:
   a first toggle switch, connected to the first terminal of the load, the first node and the second node;
   a second toggle switch, connected to the second terminal of the load, the first node and the second node;
   wherein when the second input signal is positive, the first toggle switch conducts a connection between the first terminal of the load and the first node, and the second toggle switch conducts a connection between the second terminal of the load and the second node;
   wherein when the second input signal is negative, the first toggle switch conducts a connection between the first terminal of the load and the second node, and the second toggle switch conducts a connection between the second terminal of the load and the first node.

23. The driving circuit of claim 22, wherein the polarity toggle module comprises:
   a third toggle switch, coupled to the first input terminal of the PWM controller;
   wherein when the second input signal is positive, the third toggle switch outputs the second input signal to the first input terminal of the PWM controller;
   wherein when the second input signal is negative, the third toggle switch outputs an inverted version of the second input signal to the first input terminal of the PWM controller.

24. The driving circuit of claim 23,
   wherein the first toggle switch, the second toggle switch and the third toggle switch are controlled by a first control signal, a second control signal and a third control signal, respectively;
   wherein the first control signal, the second control signal and the third control signal are synchronized.

25. The driving circuit of claim 23, wherein the polarity toggle module further comprises:
   an inverter, coupled to the third toggle switch, configured to generate the inverted version of the second input signal.

26. The driving circuit of claim 1, further comprising an auxiliary amplifying circuit, wherein the auxiliary amplifying circuit comprises:
   a first input terminal, receiving the input signal;
   a second input terminal, coupled to a first terminal of the load; and
   an output terminal, coupled to a second terminal of the load.

27. The driving circuit of claim 26,
   wherein the second input terminal of the auxiliary amplifying circuit is coupled a first node;
   wherein the output terminal of the auxiliary amplifying circuit is coupled to a second mode;
   wherein the driving circuit comprises a first toggle switch coupled to the first node, the second node and the first terminal of the load;

wherein the driving circuit comprises a second toggle switch coupled to the first node, the second node and the second terminal of the load.

28. The driving circuit of claim 1, wherein the charging circuit comprises a direct-current-to-direct-current (DC-DC) converter.

29. The driving circuit of claim 1, wherein the discharging circuit comprises a direct-current-to-direct-current (DC-DC) converter.

30. The driving circuit of claim 1, wherein the input signal is an input audio signal, and the load is a capacitive speaker load.

\* \* \* \* \*